(12) United States Patent
Hayashi et al.

(10) Patent No.: US 7,946,173 B2
(45) Date of Patent: May 24, 2011

(54) ANGULAR VELOCITY SENSOR AND PROCESS FOR PRODUCING THE SAME

(75) Inventors: Michihiko Hayashi, Fukui (JP); Masakazu Hatanaka, Fukui (JP)

(73) Assignee: Panasonic Corporation, Osaka (JP)

( * ) Notice: Subject to any disclaimer, the term of this patent is extended or adjusted under 35 U.S.C. 154(b) by 560 days.

(21) Appl. No.: 12/067,539

(22) PCT Filed: Nov. 1, 2006

(86) PCT No.: PCT/JP2006/321852
§ 371 (c)(1),
(2), (4) Date: Mar. 20, 2008

(87) PCT Pub. No.: WO2007/055133
PCT Pub. Date: May 18, 2007

(65) Prior Publication Data
US 2009/0044624 A1    Feb. 19, 2009

(30) Foreign Application Priority Data
Nov. 8, 2005  (JP) ................. 2005-323215

(51) Int. Cl.
*G01P 9/04* (2006.01)
*G01C 19/56* (2006.01)
(52) U.S. Cl. ................. 73/504.16; 73/504.12
(58) Field of Classification Search ........... 73/504.12, 73/504.16, 504.04; 310/370
See application file for complete search history.

(56) References Cited

U.S. PATENT DOCUMENTS

| | | | | |
|---|---|---|---|---|
| 4,267,731 | A * | 5/1981 | Jacobson | 73/504.15 |
| 5,014,554 | A * | 5/1991 | Terada et al. | 73/504.16 |
| 6,360,600 | B1 * | 3/2002 | Kuroki et al. | 73/504.12 |
| 6,880,399 | B1 | 4/2005 | Okoshi et al. | |
| 7,246,520 | B2 * | 7/2007 | Eguchi et al. | 73/504.16 |
| 7,441,459 | B2 * | 10/2008 | Ohuchi et al. | 73/504.16 |
| 7,583,012 | B2 * | 9/2009 | Nakashio et al. | 310/358 |
| 7,637,159 | B2 * | 12/2009 | Yamamoto et al. | 73/504.16 |
| 2005/0061073 | A1 * | 3/2005 | Kanna et al. | 73/504.04 |
| 2005/0166676 | A1 * | 8/2005 | Shimizu et al. | 73/504.12 |
| 2006/0082260 | A1 * | 4/2006 | Kinoshita | 310/348 |

FOREIGN PATENT DOCUMENTS

| | | |
|---|---|---|
| JP | 62-183147 | 8/1987 |
| JP | 64-029706 | 1/1989 |
| JP | 4-276912 | 10/1992 |
| JP | 2004-153645 | 5/2004 |
| JP | 2005-249645 | 9/2005 |
| WO | 03/046479 | 6/2003 |

OTHER PUBLICATIONS

International Search Report issued Dec. 5, 2006 in the International (PCT) Application of which the present application is the U.S. National Stage.

* cited by examiner

*Primary Examiner* — Helen C. Kwok
(74) *Attorney, Agent, or Firm* — Wenderoth, Lind & Ponack L.L.P.

(57) ABSTRACT

An angular velocity sensor has a stable characteristic in which a vibration element has a small variation in the driving efficiency even when carbon dioxide gas is generated by the reaction with oxygen gas in a package including therein the vibration element. To realize this, the angular velocity sensor has a mixed gas of inert gas and oxygen gas in the package so that the mixed gas in the package has a pressure higher than the atmospheric pressure.

16 Claims, 6 Drawing Sheets

| Element | After sealing | After reflow | After endurance test |
|---|---|---|---|
| He | Main component | Main component | Main component |
| $O_2$ | 19.5 | 3.0 | 0.1 |
| $CO_2$ | 0.1 | 4.0 | 7.0 |
| $N_2$ | 0.5 | 0.5 | 0.5 |
| $H_2O$ | 0.01 | 0.02 | 0.02 |
| $H_2$ | 0.1 | 0.1 | 0.06 |
| Hydrocarbon | < 0.01 | < 0.01 | < 0.01 |

ANGULAR VELOCITY SENSOR AND PROCESS FOR PRODUCING THE SAME

TECHNICAL FIELD

The present invention relates to an angular velocity sensor mainly used in a navigation system for a vehicle such as an automobile, various controls of a vehicle, or an image shake sensing system of a camera for example, and a process for producing the same.

BACKGROUND ART

A resonator used for this type of conventional angular velocity sensor for example had a structure as shown in FIG. 8 and FIG. 9. FIG. 8 is a perspective view illustrating a resonator used in a conventional angular velocity sensor for example. FIG. 9 is a sectional side view illustrating a vibration element in the resonator.

As shown in FIG. 8 and FIG. 9, vibration element 1 is composed of diaphragm 2; piezoelectric body layer 3 consisting of zinc oxide that is provided on an upper face of diaphragm 2; and upper electrode layer 4 consisting of Ti and Ni that is provided on an upper face of piezoelectric body layer 3. Support section 5 supports vibration element 1. Spacers 6 support vibration element 1 from upper and lower sides. Dumet wires 7 support spacers 6 from upper and lower sides. Glass tube 8 is welded to surround the periphery of dumet wire 7 and the interior of dumet wire 7 is filled with oxygen gas of 10 KPa to 30 KPa.

When vibration element 1 is subjected to a high temperature for melting glass tube 8 in a step of producing vibration element 1 in a resonator used in a conventional angular velocity sensor for example, upper electrode layer 4 formed on piezoelectric body layer 3 deprives piezoelectric body layer 3 of oxygen. This causes piezoelectric body layer 3 to show a conductive property, preventing piezoelectric body layer 3 from functioning as a piezoelectric body. To prevent this, a conventional resonator has been structured so that oxygen gas is filled in the interior of dumet wire 7 to prevent piezoelectric body layer 3 from being deprived of oxygen gas.

In the case of the conventional angular velocity sensor, when a substance other than piezoelectric body layer 3 reacts with oxygen gas in dumet wire 7 to generate carbon dioxide gas, an increased molecular weight causes an increase in the pressure in dumet wire 7 from 10 kPa to 30 kPa, for example, showing an increase of 20 kPa.

When a driving efficiency of an angular velocity sensor is defined to have a value obtained by dividing a driving voltage by a monitor voltage, the driving efficiency of 1 (one) corresponding to the internal pressure of dumet wire 7 of 10 kPa varies to 1.4 when the internal pressure of dumet wire 7 is 30 kPa.

The technique as described above is disclosed by background art publications such as International Publication Number WO 03/046479 (pamphlet), Japanese Patent Unexamined Publication No. S64-29706, and Japanese Patent Unexamined Publication No. S62-183147.

In the above conventional structure, oxygen gas of 10 kPa to 30 kPa is filled in dumet wire 7 and thus an initial molecular weight in dumet wire 7 is small to enable a small driving resistance by the oxygen gas of vibration element 1. However, when the reaction with oxygen gas causes carbon dioxide gas, the molecular weight in dumet wire 7 is increased to cause an increased driving resistance of vibration element 1, which causes a disadvantage of a significant change in the driving efficiency of vibration element 1.

SUMMARY OF THE INVENTION

The present invention solves the above-described disadvantage in the conventional design. The present invention provides an angular velocity sensor having a stable characteristic in which a vibration element has a small variation in the driving efficiency even when carbon dioxide gas is generated by the reaction with oxygen gas in a package including therein the vibration element.

To realize this, the angular velocity sensor of the present invention includes: a vibration element, the vibration element including a diaphragm, driving films including therein a piezoelectric body layer consisting of metal oxide formed on the diaphragm for driving the diaphragm, and detection films including therein a piezoelectric body layer consisting of metal oxide formed on the diaphragm for sensing a deformation of the diaphragm due to the Coriolis force; and a package that directly or indirectly supports the vibration element and that includes therein the vibration element. The package includes therein mixed gas of inert gas and oxygen gas, and the mixed gas in the package has a pressure higher than an atmospheric pressure. Since this structure is designed so that the package is sealed to include therein mixed gas of inert gas and oxygen, the angular velocity sensor can be prevented from having a varied sensitivity even when the angular velocity sensor is used under a high temperature, thus providing a highly-durable angular velocity sensor. Furthermore, the mixed gas in the package has a pressure higher than the atmospheric pressure. Thus, an initial molecular weight in the package is increased to provide an increased driving resistance of the mixed gas of inert gas and oxygen gas. Thus, even when carbon dioxide gas is generated by the reaction with oxygen gas in the package to cause an increase in the molecular weight of the package, the vibration element can have a small increase in the driving resistance, thus reducing the variation in the driving efficiency. Therefore, an angular velocity sensor having a stable characteristic can be provided.

DETAILED DESCRIPTION OF PREFERRED EMBODIMENTS

Hereinafter, embodiments of the present invention will be described.

Figure 1:
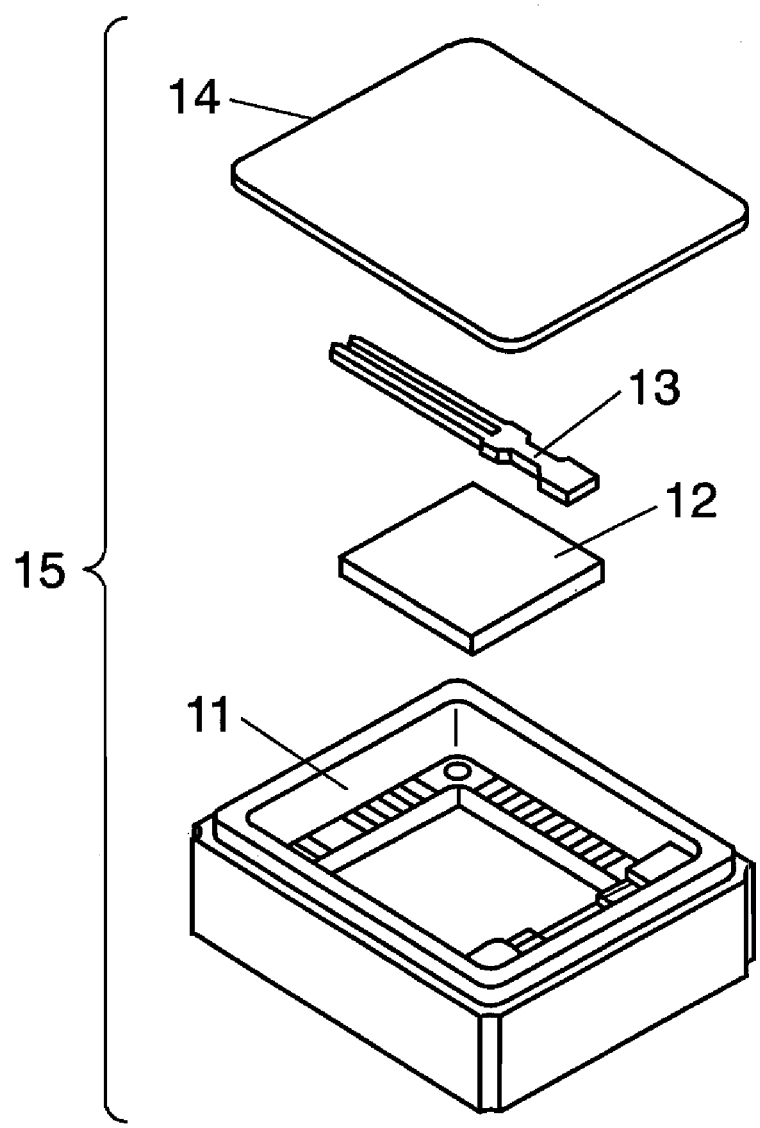
FIG. 1 is an exploded perspective view illustrating an angular velocity sensor in the one embodiment of the present invention.
Figure 2:
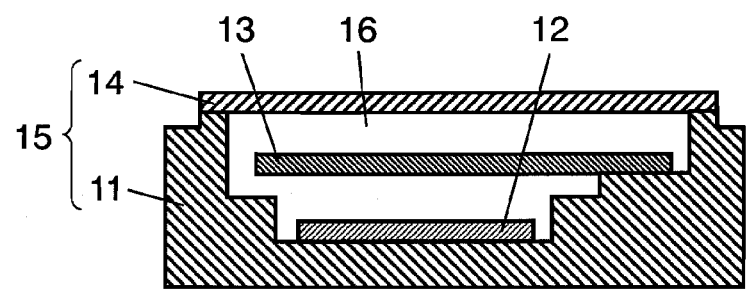
FIG. 2 is a front sectional view illustrating the angular velocity sensor in the one embodiment of the present invention.

FIG. 1 is an exploded perspective view illustrating an angular velocity sensor in one embodiment of the present invention. FIG. 2 is a front sectional view illustrating the angular velocity sensor.

As shown in FIG. 1 and FIG. 2, an embodiment of the angular velocity sensor has package 15. Package 15 consists of ceramic package body 11; IC 12; vibration element 13 having a tuning fork-like shape; and metallic cover 14 combined with package body 11 to provide an interior space.

Package 15 accommodates therein IC 12 and vibration element 13. Mixed gas 16 is filled in the internal space of package 15. Mixed gas 16 is obtained by mixing helium as inert gas with oxygen gas. Since package 15 is sealed, mixed gas 16 is prevented from leaking from package 15 to the outside.

Figure 3:
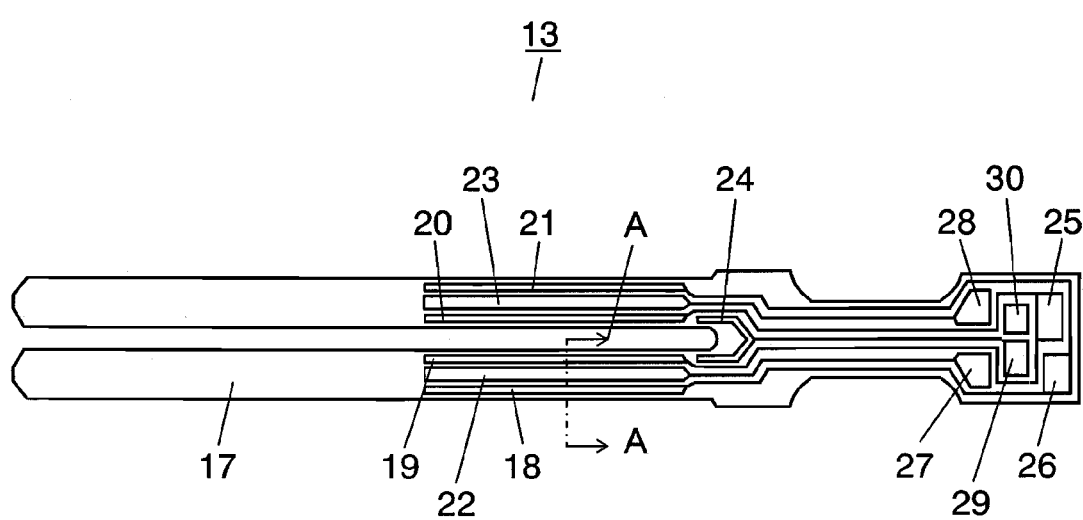
FIG. 3 is a plan view illustrating a vibration element of the angular velocity sensor in the one embodiment of the present invention.
Figure 4:
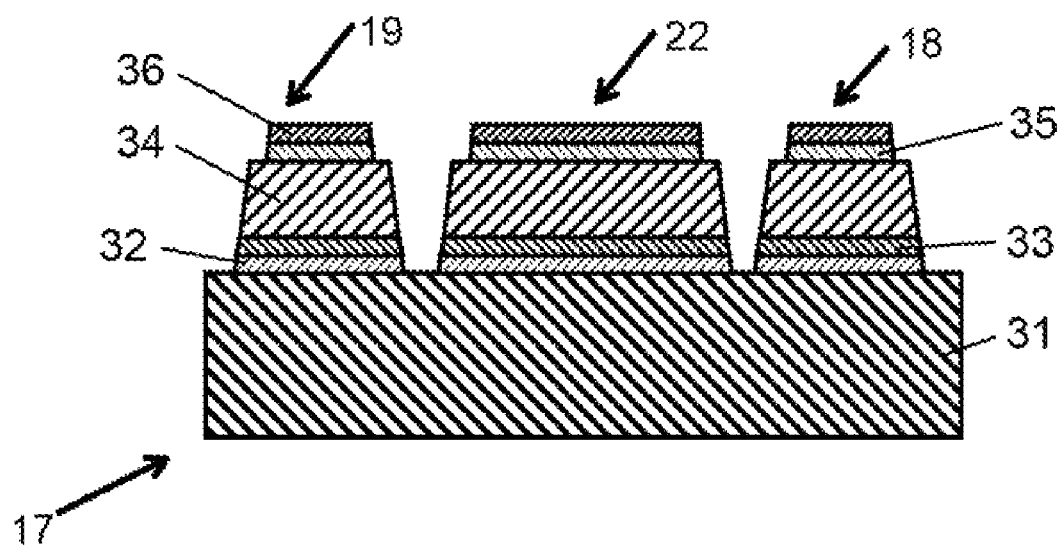
FIG. 4 is a cross-sectional view taken along the line A-A of FIG. 3.

FIG. 3 is a plan view illustrating vibration element 13 constituting the angular velocity sensor in one embodiment of the present invention. FIG. 4 is a cross-sectional view taken along the line A-A of FIG. 3.

As shown in FIG. 3 and FIG. 4, vibration element 13 has: diaphragm 17 that is made of Si and that has a tuning fork-like shape; driving films 18 to 21 that are provided on diaphragm 17 and that are used to drive diaphragm 17; detection films 22 and 23 that are provided on diaphragm 17 and that sense a change in the shape of diaphragm 17 due to a Coriolis force; and monitor film 24 that is provided on diaphragm 17 and that is used to monitor the driving state of diaphragm 17. Specific structures of driving film 18 to 21, detection films 22 and 23, and monitor film 24 described above will be described later. Vibration element 13 also has driving terminals 25 and 26, detection terminals 27 and 28, and monitor terminal 29 that are electrically connected to driving film 18 to 21, detection films 22 and 23, and monitor film 24, respectively. Vibration element 13 also has reference potential terminal 30.

Si substrate 31 corresponds to diaphragm 17. Lower electrode contact layer 32 is formed on Si substrate 31. Lower electrode contact layer 32 is made of Ti. Lower electrode layer 33 made of Pt is formed on lower electrode contact layer 32. Piezoelectric body layer 34 made of PZT is formed on lower electrode layer 33. PZT is metal oxide. Upper electrode contact layer 35 is formed on piezoelectric body layer 34. Upper electrode contact layer 35 is made of Ti as in lower electrode contact layer 32. Upper electrode layer 36 made of Au is formed on upper electrode contact layer 35. Lower electrode contact layer 32 functions as a contact layer for improving the contact between piezoelectric body layer 34 and upper electrode layer 36. Upper electrode contact layer 35 and lower electrode contact layer 32 are one embodiment of the contact layer of the present invention. Both of upper electrode contact layer 35 and lower electrode contact layer 32 may exist, or either one of upper electrode contact layer 35 and lower electrode contact layer 32 may exist.

Driving films 18 to 21, detection films 22 and 23, and monitor film 24 described above are provided by layering lower electrode contact layer 32, lower electrode layer 33, piezoelectric body layer 34, upper electrode contact layer 35, and upper electrode layer 36, respectively. As illustrated in FIG. 3, the driving films and detection films extend in parallel along the tines of the tuning-fork shaped diaphragm 17, with one detection film being disposed between two driving films, on each tine. Also, as illustrated in FIG. 4, the driving films and detection films are coplanar with each other.

In order to improve the contact between lower electrode layer 33 and piezoelectric body layer 34 while providing piezoelectric body layer 34 with a desired crystal structure, lower electrode layer 33 and piezoelectric body layer 34 may have therebetween a buffer layer that consists of ferroelectric material including at least any one of Pb, Ti, and Zr. This buffer layer may be made of PLZT ((Pb, La) (Zr, Ti) $O_3$) for example.

With regard to the angular velocity sensor having the structure as described above, the following section will describe a process for producing the angular velocity sensor.

First, the outline of a process for producing vibration element 13 will be described.

On one surface of Si substrate 31 having a wafer-like shape, lower electrode contact layer 32, lower electrode layer 33, piezoelectric body layer 34, upper electrode contact layer 35, and upper electrode layer 36 are layered in this order. The layering may be carried out by vapor deposition or sputtering.

Next, the respective layers are etched so as to have a predetermined shape. The etching may be carried out by dry etching. A preferred dry etching is a reactive ion etching.

Next, Si substrate 31 can be subjected to the dry etching or machining to have a predetermined tuning fork-like shape, thereby providing separate vibration element 13. In this manner, vibration element 13 can be produced.

Next, IC 12 is mounted and fixed by adhesive agent at a predetermined position of package body 11. Then, the wiring of package body 11 is electrically connected to the wiring of IC 12 by a wire bonding. Then, vibration element 13 is also mounted and fixed by adhesive agent. Then, the wiring of package body 11 is electrically connected to driving terminals 25 and 26, detection terminals 27 and 28, monitor terminal 29, and reference potential terminal 30 of vibration element 13 by the wire bonding. IC 12 and vibration element 13 also can be face-down mounted.

Next, cover 14 is set to package body 11 to join and seal the former and the latter. The sealing may be carried out by resistance welding or seam welding. This sealing is carried out under a mixed gas atmosphere of helium as inert gas and oxygen gas. Oxygen gas is preferably mixed with a ratio of 1 to 20% by volume. As a result, package 15 is obtained to prevent mixed gas 16 in package 15 from leaking from package 15 to the outside.

By the production process as described above, the angular velocity sensor of the present invention is produced.

Next, the angular velocity sensor of the present invention will be described with regard to the characteristic.

Figure 5:
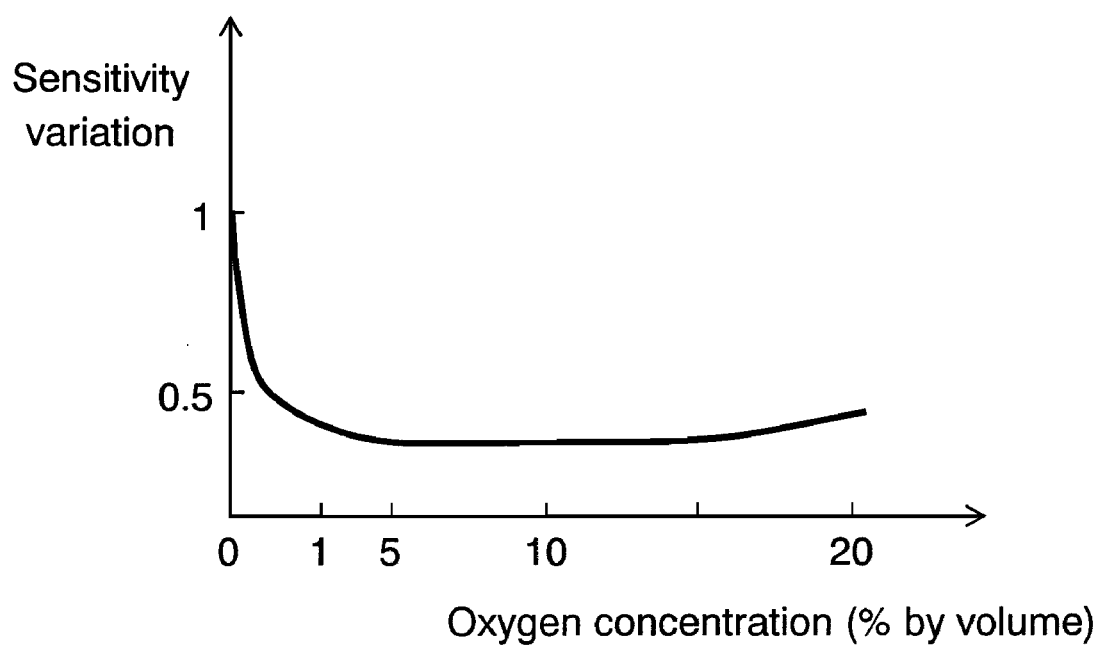
FIG. 5 illustrates a relation between the concentration of oxygen in a package and the sensitivity variation of the angular velocity sensor in the one embodiment of the present invention.

FIG. 5 illustrates a relation between oxygen concentration and sensitivity variation in the package of the angular velocity sensor in one embodiment of the present invention. The values in FIG. 5 were obtained by an experiment in which an angular velocity sensor having the same structure as that of the angular velocity sensor in the one embodiment of the present invention was used except that the oxygen in package 15 had a different concentration. In the experiment, a current test of 5V was carried out at 105 degrees C. and sensitivity variations before and after the current test were calculated.

The following section will describe the sensitivity variation and a detection principle of the angular velocity sensor. The angular velocity sensor detects an angular velocity based on the following detection principle. In this detection principle, an alternating current signal is given to driving films 18 to 21 in the width direction to vibrate so that driving film 18 and driving film 21 have opposite phases and driving film 19 and driving film 20 have opposite phases, respectively, thereby opening or closing two legs of the tuning fork-like shape of vibration element 13. When an angular velocity is given around the center axis of the vibration element 13 in this status, the angular velocity proportionally causes the Coriolis force that causes vibration element 13 to vibrate in the thickness direction orthogonal to the driving and vibration direction. This vibration causes a surface charge on detection films 22 and 23 that can be outputted as a voltage value. Then, the sensitivity of the angular velocity is calculated based on an output voltage of the angular velocity sensor. For example, the sensitivity of the angular velocity is calculated by dividing a difference between an output voltage generated when a fixed angular velocity is applied in one direction around the center axis of vibration element 13 and an output voltage generated when the same angular velocity is applied in the opposite direction by a difference between the angular velocities.

In FIG. 5, the horizontal axis represents an oxygen concentration shown as percentage by volume. The oxygen concentration shows concentration when package 15 is sealed. The vertical axis represents sensitivity variation. The sensitivity variation is represented by a ratio to the sensitivity of 1 when the oxygen concentration is 0% by volume.

As can be seen from FIG. 5, the oxygen concentration of 0% by volume corresponds to a high sensitivity variation but the oxygen concentration of 1% by volume or more corresponds to the sensitivity variation that is about a half of that when the oxygen concentration is 0% by volume. Thus, the oxygen concentration is preferably 1% by volume or more.

Since oxygen is a combustion-enhancing gas, it is not preferable to mix oxygen with an excessively-high concentration from the viewpoint of handling. Thus, oxygen is preferably mixed with the oxygen concentration of air (i.e., about 20% by volume) as an upper limit.

Next, the following section will describe a temporal change of gaseous matter components in package 15.

Figures 6, 7:
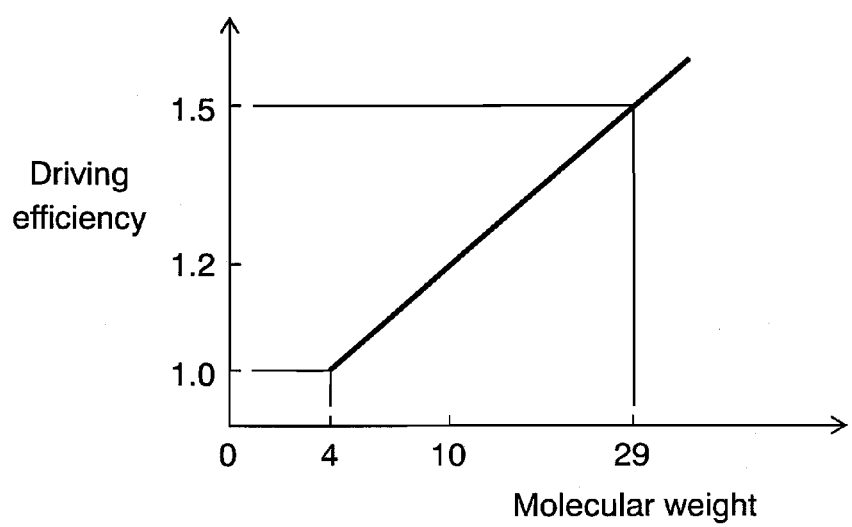
FIG. 6 illustrates a temporal change in gaseous matter components in the package of the angular velocity sensor in the one embodiment of the present invention.
FIG. 7 illustrates a relation between the molecular weight of mixed gas in the package and the driving efficiency of the angular velocity sensor in the one embodiment of the present invention.
Figure 8:
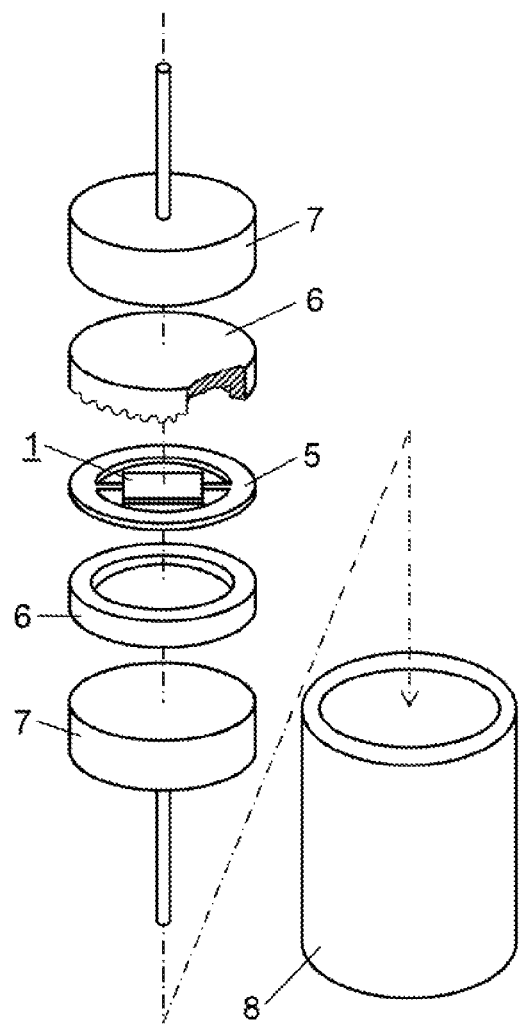
FIG. 8 is a perspective view illustrating a resonator used in a conventional angular velocity sensor for example.
Figure 9:
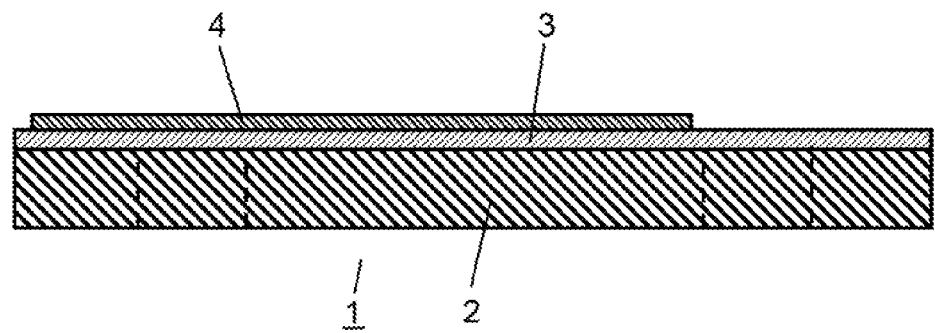
FIG. 9 is a sectional side view illustrating a vibration element in a resonator used in a conventional angular velocity sensor for example.

FIG. 6 shows a temporal change of gaseous matter components in the package of the angular velocity sensor in one embodiment of the present invention. Values in FIG. 6 are: those of gaseous matter components in package 15 immediately after sealing package 15 by cover 14 with mixed gas obtained by mixing oxygen of a volume concentration of about 20% with helium; those of gaseous matter components in package 15 after the reflow of the angular velocity sensor completed by adding a thermal history at the assembly adjustment (e.g., IC burn-in, anneal, temperature test) to package 15; and those of gaseous matter components in package 15 that are measured after the reflow and an additional endurance test in which 5V is applied to the angular velocity sensor at 105 degrees C. for 1000 hours. In FIG. 6, the points at which the respective values were measured are shown as "after sealing", "after reflow", and "after endurance test".

As can be seen from FIG. 6, the thermal history at the assembly adjustment and the reflow cause a decrease in oxygen gas to cause in turn an increase in carbon dioxide. This is presumably caused because the decomposition reaction of the resin of the epoxy-base adhesive agent used for fixing IC 12 and vibration element 13 in package 15 is promoted to cause a part of the oxygen in package 15 to react with the decomposed resin. FIG. 6 also shows that the angular velocity sensor after the reflow and additional endurance test shows a further decrease in the concentration of oxygen gas.

The angular velocity sensor after the reflow and the angular velocity sensor after the additional endurance test show oxygen in an amount that is equal to or lower than the amount of oxygen in the package immediately after the sealing. The reason is presumably that oxygen existing as gaseous matter in package 15 is reduced to proportionally supply oxygen to piezoelectric body layer 34.

As can be seen from the above result, the use of the angular velocity sensor under a high temperature presumably causes the decreased oxygen gas in package 15 and a part of the oxygen existing at the initial stage to react with the resin in package 15, for example, to change into carbon dioxide and another part thereof is absorbed in piezoelectric body layer 34. Therefore, it can be considered that package 15 filled with oxygen gas can significantly reduce the amount of oxygen in piezoelectric body layer 34 that is absorbed in upper electrode contact layer 35 and can reduce the breakaway of oxygen.

Considering the fact that a part of the oxygen existing in package 15 at the initial stage is not absorbed in piezoelectric body layer 34 but reacts with the resin in package 15, an excessively-high concentration of oxygen filled in package 15 is not preferred because such an excessively-high concentration may cause more reactions with substance in package 15 other than piezoelectric body layer 34. When gaseous matter other than oxygen gas is mixed with the oxygen gas in order to reduce the concentration of oxygen gas, not gaseous matter that is reactive with organic resin but inert gas is preferably filled.

Next, the following section will describe mixed gas 16 filled in package 15 and the driving efficiency.

FIG. 7 illustrates a relation between the molecular weight of mixed gas in the package and the driving efficiency of the angular velocity sensor in one embodiment of the present invention.

In FIG. 7, the horizontal axis represents the molecular weight of mixed gas 16 and the vertical axis represents the driving efficiency. The driving efficiency can be calculated by dividing the driving voltage by the monitor voltage. Thus, the lower the driving efficiency is, the better the driving efficiency is.

As is clear from FIG. 7, the lower the molecular weight is, the better the driving efficiency is. This shows that helium having a small molecular weight is most preferred among the inert gases. This also shows that mixed gas 16 of helium and oxygen gas filled in package 15 provides a better driving efficiency than that obtained when only oxygen gas is filled in package 15 or when air is introduced in package 15.

When assuming a case where the reaction of substance other than piezoelectric body layer 34 in package 15 with oxygen gas causes carbon dioxide gas in the angular velocity sensor in one embodiment of the present invention, an increased molecular weight causes an increase in the pressure in package 15 from 100 kPa to 120 kPa for example, showing an increase of 20 kPa.

When the driving efficiency of the angular velocity sensor is defined as a value obtained by dividing the driving voltage by the monitor voltage, the driving efficiency of 1 corresponding to the pressure in package 15 of 100 kPa varies to 1.2 when the pressure in package 15 is 120 kPa.

Specifically, in the angular velocity sensor in one embodiment of the present invention, mixed gas 16 in package 15 has a pressure higher than atmospheric pressure. This causes an increase in the initial molecular weight in package 15 to cause an increase in the driving resistance by mixed gas 16 of inert gas and oxygen gas. Thus, even when the reaction with the oxygen gas in package 15 causes carbon dioxide gas and the molecular weight in package 15 is increased, an increase in the driving resistance of vibration element 13 can be reduced to reduce the variation in the driving efficiency. Thus, an angular velocity sensor having a stable characteristic can be provided.

In the angular velocity sensor in one embodiment of the present invention, mixed gas 16 of inert gas and oxygen gas is filled in package 15. Thus, oxygen of piezoelectric body layer 34 consisting of metal oxide can be prevented from being deprived of by upper electrode contact layer 35. This can reduce the variation in the sensitivity of the angular velocity sensor even when the angular velocity sensor is used under a high temperature environment. Furthermore, the gaseous matter in package 15 composed of not oxygen gas only but mixed gas 16 of inert gas and oxygen gas can reduce the reaction with resin in package 15 for example.

Furthermore, the side section of piezoelectric body layer 34 exposed in package 15 to contact with oxygen in package 15 can recover the plasma damage at the side section of piezoelectric body layer 34 during the dry etching, thereby preventing piezoelectric body layer 34 from deteriorating.

Furthermore, oxygen gas in package 15 that is provided with a ratio of 1 to 20% by volume to all gaseous matters in package 15 can reduce the variation in the sensitivity of the angular velocity sensor to about ½ or lower and also can appropriately reduce the reaction of the resin in package 15 for example with oxygen.

Furthermore, the use of helium as inert gas having a small average molecular weight can reduce the viscosity resistance to improve the driving efficiency.

Although the above embodiment of the present invention has been described as having lower electrode contact layer 32 made of Ti, lower electrode contact layer 32 also may be made of Cr.

A $SiO_2$ layer is preferably formed between Si substrate 31 and lower electrode contact layer 32 because the existence of the $SiO_2$ layer can provide a superior contact.

Although vibration element 13 is directly fixed and supported in package 15, vibration element 13 also may be indirectly fixed and supported via a support and fixing member.

The contact layer formed between the piezoelectric body layer and the electrode layer may be formed in accordance with the contact between the piezoelectric body layer and the electrode layer. Although the embodiment of the present invention has provided upper electrode contact layer 35 between piezoelectric body layer 34 and upper electrode layer 36, another structure also may be used in which contact layers are formed only on lower electrode layer 33 and piezoelectric body layer 34 or this contact layer and upper electrode contact layer 35 are formed together.

As described above, the angular velocity sensor of the present invention includes: vibration element 13, vibration element 13 including diaphragm 17, driving films 18 to 21 including therein piezoelectric body layer 34 consisting of metal oxide for driving diaphragm 17, and detection films 22 and 23 including therein piezoelectric body layer 34 consisting of metal oxide formed on diaphragm 17 for sensing the deformation of diaphragm 17 due to the Coriolis force; and package 15 that directly or indirectly supports vibration element 13 and that includes therein vibration element 13. Mixed gas 16 of inert gas and oxygen gas is provided in package 15 to have a pressure higher than the atmospheric pressure. The structure is designed so that mixed gas 16 of inert gas and oxygen gas is provided in package 15 and package 15 is sealed. This structure thus can prevent the angular velocity sensor from having a varied sensitivity even when the angular velocity sensor is used under a high temperature and thus can provide a highly-durable angular velocity sensor. Since mixed gas 16 in package 15 has a pressure higher than the atmospheric pressure, an increase in the initial molecular weight in package 15 is obtained to cause an increase in the initial driving resistance by mixed gas 16 of inert gas and oxygen gas. This can provide a small increase in the driving resistance of vibration element 13 even when the reaction with oxygen gas in package 15 causes carbon dioxide gas to cause an increase in the molecular weight in package 15, thus reducing the variation in the driving efficiency. Thus, an angular velocity sensor having a stable characteristic can be provided.

Also according to the present invention, driving films 18 to 21 and detection films 22 and 23 are formed by lower electrode layer 33, piezoelectric body layer 34 consisting of metal oxide formed on lower electrode layer 33, upper electrode layer 36 formed on piezoelectric body layer 34, and a contact layer that is formed between lower electrode layer 33 and piezoelectric body layer 34 and/or between piezoelectric body layer 34 and upper electrode layer 36, respectively. According to this structure, the existence of the contact layer formed between lower electrode layer 33 and piezoelectric body layer 34 and/or between piezoelectric body layer 34 and upper electrode layer 36 can improve the contact of piezoelectric body layer 34 with upper electrode layer 36 or lower electrode layer 33.

Also according to the present invention, the side section of piezoelectric body layer 34 is exposed in package 15. Since this structure allows the side section of piezoelectric body layer 34 to be exposed to have a contact with the oxygen gas in package 15, this structure can reduce the breakaway of oxygen due to disordered crystals in the side section of piezoelectric body layer 34 caused by plasma damage by the dry etching. This can suppress the piezoelectric body layer 34 from deteriorating.

Also according to the present invention, oxygen gas is included in package 15 with a ratio of 1 to 20% by volume to all gaseous matters in package 15. This provides the concentration of oxygen gas in a range from 1% by volume to the atmospheric pressure (i.e., about 20% by volume). This can significantly reduce the variation in the sensitivity of the angular velocity sensor and can eliminate an adverse influence on the periphery even in the case of the failure of the sealing of the package.

Also according to the present invention, helium is provided as the inert gas. Since helium has a small molecular weight, the angular velocity sensor can have an improved driving efficiency.

Also according to the present invention, a process of producing an angular velocity sensor is provided. The angular velocity sensor includes: vibration element 13, vibration element 13 including diaphragm 17, driving films 18 to 21 including therein piezoelectric body layer 34 consisting of metal oxide for driving diaphragm 17, and detection films 22 and 23 including therein piezoelectric body layer 34 consisting of metal oxide formed on diaphragm 17 for sensing the deformation of diaphragm 17 due to the Coriolis force; and package 15 that directly or indirectly supports vibration element 13 and that includes therein vibration element. This process includes a step of storing vibration element 13 in package 15 in an atmosphere of mixed gas 16 of inert gas and oxygen gas, and a step of sealing package 15. According to this production process, mixed gas 16 of inert gas and oxygen gas is filled in package 15. This can reduce the leakage of oxygen of the metal oxide constituting piezoelectric body layer 34. This can reduce the variation in the sensitivity of the angular velocity sensor even when the angular velocity sensor is used under a high temperature.

Also according to the present invention, this method includes: a step of forming driving films 18 to 21 and detection films 22 and 23 on diaphragm 17 respectively to provide lower electrode layer 33; a step of forming piezoelectric body layer 34 consisting of metal oxide on lower electrode layer 33; a step of forming upper electrode layer 36 on piezoelectric body layer 34; and a step of forming a contact layer between lower electrode layer 33 and piezoelectric body layer 34 and/or between piezoelectric body layer 34 and upper electrode layer 36. Thereafter, the respective layers are dry-etched so as to have a predetermined shape. According to this production process, the contact layer formed between lower electrode layer 33 and piezoelectric body layer 34 and/or between piezoelectric body layer 34 and upper electrode layer 36 can improve the contact of piezoelectric body layer 34 with upper electrode layer 36 or lower electrode layer 33.

Also according to the present invention, the side section of piezoelectric body layer 34 is exposed in package 15. Since this structure allows the side section of piezoelectric body layer 34 to be exposed to have contact with oxygen gas in package 15, this can reduce the breakaway of oxygen due to disordered crystals in the side section of piezoelectric body layer 34 caused by plasma damage by the dry etching. This can reduce the deterioration of piezoelectric body layer 34.

Also according to the present invention, a step of providing vibration element 13 in package 15 is carried out with oxygen gas having a ratio of 1 to 20% by volume. Since this production process uses oxygen gas with concentration in a range from 1% by volume to atmospheric pressure (i.e., about 20% by volume), this can significantly reduce the variation in the sensitivity of the angular velocity sensor and can eliminate an adverse influence on the periphery even in the case of the failure of the sealing of package 15.

Also according to the present invention, helium is provided as the inert gas. Since this production process uses helium having a molecular weight, the angular velocity sensor can have an improved driving efficiency.

As described above, the angular velocity sensor of the present invention is structured so that package 15 including therein mixed gas 16 of inert gas and oxygen gas is sealed. Thus, even when the angular velocity sensor is used under a high temperature, the angular velocity sensor can be prevented from having a varied sensitivity. Thus, a highly-durable angular velocity sensor can be provided. Furthermore, since mixed gas 16 in package 15 has a temperature higher than the atmospheric pressure, this provides an increased initial molecular weight in package 15 to provide in turn an increased initial driving resistance by mixed gas 16 of inert gas and oxygen gas. Thus, even when the reaction with oxygen gas in the package generates carbon dioxide gas to cause an increased molecular weight in package 15, vibration element 13 can have a small increase in the driving resistance. This can reduce the variation in the driving efficiency, thus providing an angular velocity sensor having a stable characteristic.

With the angular velocity sensor according to the present invention, even when the angular velocity sensor is used under a high temperature, the angular velocity sensor can be prevented from having a varied sensitivity, thus providing a highly-durable angular velocity sensor. Furthermore, the mixed gas in the package provided to have a pressure higher than the atmospheric pressure can reduce the variation in the driving efficiency even when the reaction with oxygen gas in the package generates carbon dioxide gas to cause an increased molecular weight in the package. This can provide an angular velocity sensor having a stable characteristic.

Therefore, the angular velocity sensor according to the present invention can be advantageously used in various sensors such as those for vehicles and has very high industrial applicability.

The invention claimed is:

1. An angular velocity sensor comprising:
a vibration element, the vibration element including a diaphragm, driving films including therein a piezoelectric body layer consisting of metal oxide formed on the diaphragm for driving the diaphragm, and detection films including therein a piezoelectric body layer consisting of metal oxide formed on the diaphragm for sensing a deformation of the diaphragm due to a Coriolis force; and
a package that directly or indirectly supports the vibration element and that includes therein the vibration element;
wherein the package includes therein mixed gas of inert gas and oxygen gas, and the mixed gas in the package has a pressure higher than an atmospheric pressure.

2. The angular velocity sensor according to claim 1, wherein:
the driving films and the detection films are composed of a lower electrode layer, the piezoelectric body layer consisting of metal oxide formed on the lower electrode layer, an upper electrode layer formed on the piezoelectric body layer, and a contact layer formed on at least one of spaces between the lower electrode layer and the piezoelectric body layer and between the piezoelectric body layer and the upper electrode layer, respectively.

3. The angular velocity sensor according to claim 1, wherein:
for each of the driving films and detection films, a side section of the piezoelectric body layer is exposed in the package.

4. The angular velocity sensor according to claim 1, wherein:
the oxygen gas is provided in the package with a ratio of 1 to 20% by volume to all gaseous matters in the package.

5. The angular velocity sensor according to claim 1, wherein:
the inert gas is helium.

6. The process for producing an angular velocity sensor according to claim 1, wherein:
said mixed gas consists essentially of inert gas and oxygen gas.

7. The process for producing an angular velocity sensor according to claim 1, wherein
the diaphragm of the vibration element is constituted as a tuning-fork shaped diaphragm having two parallel tines extending from a center base part; and
said driving films and detection films are formed on said tines so as to be mutually coplanar and extend in parallel with one another.

8. The process for producing an angular velocity sensor according to claim 7, wherein
each one of said tines has thereon one of said detection films and two of said driving films; and
on each one of said tines, said one of said detection films is disposed between and in parallel with said two of said driving films.

9. An angular velocity sensor comprising:
a vibration element, the vibration element including a diaphragm, driving films including therein a piezoelectric body layer comprising metal oxide formed on the diaphragm for driving the diaphragm, and detection films including therein a piezoelectric body layer comprising metal oxide formed on the diaphragm for sensing a deformation of the diaphragm due to a Coriolis force; and a package that directly or indirectly supports the vibration element and that includes therein the vibration element;

wherein the package includes therein mixed gas of inert gas and oxygen gas, and the mixed gas in the package has a pressure higher than an atmospheric pressure.

10. The angular velocity sensor according to claim 9, wherein:

the driving films and the detection films are composed of a lower electrode layer, the piezoelectric body layer comprising metal oxide formed on the lower electrode layer, an upper electrode layer formed on the piezoelectric body layer, and a contact layer formed on at least one of spaces between the lower electrode layer and the piezoelectric body layer and between the piezoelectric body layer and the upper electrode layer, respectively.

11. The angular velocity sensor according to claim 9, wherein:

for each of the driving films and detection films, a side section of the piezoelectric body layer is exposed in the package.

12. The angular velocity sensor according to claim 9, wherein:

the oxygen gas is provided in the package with a ratio of 1 to 20% by volume to all gaseous matters in the package.

13. The angular velocity sensor according to claim 9, wherein:

the inert gas is made of helium.

14. The process for producing an angular velocity sensor according to claim 9, wherein said mixed gas consists essentially of inert gas and oxygen gas.

15. The process for producing an angular velocity sensor according to claim 9, wherein the diaphragm of the vibration element is constituted as a tuning-fork shaped diaphragm having two parallel tines extending from a center base part; and said driving films and detection films are formed on said tines so as to be mutually coplanar and extend in parallel with one another.

16. The process for producing an angular velocity sensor according to claim 15, wherein each one of said tines has thereon one of said detection films and two of said driving films; and on each one of said tines, said one of said detection films is disposed between and in parallel with said two of said driving films.

* * * * *